(12) United States Patent
Sarajlic

(10) Patent No.: US 11,174,155 B2
(45) Date of Patent: Nov. 16, 2021

(54) METHOD OF PROVIDING A PLURALITY OF THROUGH-HOLES IN A LAYER OF STRUCTURAL MATERIAL

(71) Applicant: Cytosurge AG, Glattbrugg (CH)

(72) Inventor: Edin Sarajlic, Zutphen (NL)

(73) Assignee: Cytosurge AG

( * ) Notice: Subject to any disclaimer, the term of this patent is extended or adjusted under 35 U.S.C. 154(b) by 0 days.

(21) Appl. No.: 16/619,512

(22) PCT Filed: Jun. 18, 2018

(86) PCT No.: PCT/NL2018/050396
§ 371 (c)(1),
(2) Date: Dec. 5, 2019

(87) PCT Pub. No.: WO2018/236211
PCT Pub. Date: Dec. 27, 2018

(65) Prior Publication Data
US 2020/0165125 A1 May 28, 2020

(30) Foreign Application Priority Data

Jun. 19, 2017 (NL) ..................................... 2019090

(51) Int. Cl.
*B81C 1/00* (2006.01)
(52) U.S. Cl.
CPC .... *B81C 1/0015* (2013.01); *B81C 2201/0132* (2013.01); *B81C 2201/0133* (2013.01); *B81C 2201/0159* (2013.01)
(58) Field of Classification Search
CPC .......... B81C 1/0015; B81C 2201/0132; B81C 2201/0133; B81C 2201/0159; B81C 1/00087; B81B 2201/12; B81B 2203/0118; B81B 2203/0353; B81B 2201/057

See application file for complete search history.

(56) References Cited

U.S. PATENT DOCUMENTS

| | | | | |
|---|---|---|---|---|
| 5,925,975 A | * | 7/1999 | Suzuki | H01J 3/022 313/336 |
| 2005/0130551 A1 | * | 6/2005 | Cross | G01Q 70/06 445/50 |
| 2007/0122313 A1 | | 5/2007 | Li et al. | |

(Continued)

OTHER PUBLICATIONS

Berenschot et al. ("3D-Nanomachining using Corner Lithography," Proceeding of 3rd IEEE int. Conf. on Nano/Micro Engineered and Molecular systems, Sanya, China, pp. 729-732, 2008) (Year: 2008).*

(Continued)

*Primary Examiner* — Yasser A Abdelaziez
(74) *Attorney, Agent, or Firm* — The Webb Law Firm

(57) ABSTRACT

A method of providing a MEMS device including a through-hole in a layer of structural material using a multitude of MEMS method steps. A versatile method to create a through-hole, in particular a multitude thereof, involves a step of exposing a polymeric layer of positive photoresist in a direction from the outer surface of the positive photoresist to light resulting in an exposed layer of positive photoresist including relatively strongly depolymerized positive photoresist in the top section of a recess while leaving relatively less strongly depolymerized positive photoresist in the bottom section of the recess.

5 Claims, 7 Drawing Sheets

(56) References Cited

U.S. PATENT DOCUMENTS

2014/0098422 A1\* 4/2014 Fukuda ............ B29D 11/00346
359/601
2017/0247252 A1\* 8/2017 Sarajlic ................. B01J 19/081

OTHER PUBLICATIONS

Burouni et al.; "Wafer-scale fabrication of nanoapertures using corner lithography"; Nanotechnology; 2013; pp. 1-10; vol. 24; IOP Publishing Ltd.; United Kingdom.
Sarajlic et al.; "Fabrication of 3D Nanowire Frames by Conventional Micromachining Technology"; Transducers '05; Jun. 5-9, 2005; pp. 27-30; The 13th International Conference on Solid-State Sensors, Actuators and Microsystems; Seoul, Korea.

\* cited by examiner 200
201  202

210

210

202

METHOD OF PROVIDING A PLURALITY OF THROUGH-HOLES IN A LAYER OF STRUCTURAL MATERIAL

CROSS REFERENCE TO RELATED APPLICATIONS

This application is the United States national phase of International Application No. PCT/NL2018/050396 filed Jun. 18, 2018, and claims priority to The Netherlands Patent Application No. 2019090 filed Jun. 19, 2017, the disclosures of which are hereby incorporated by reference in their entirety.

The present invention relates to a method of providing a MEMS device comprising a through-hole in a layer of structural material using a multitude of MEMS method steps.

Various methods of providing a MEMS device are known in the art using MEMS method steps. Examples of MEMS method steps are providing a layer (by growing or deposition) and etching (such as RIE). Various applications require the presence of holes in a layer of material. The object of the present invention is to provide a method for manufacturing MEMS devices comprising through-holes of a desired size for a variety of different material.

SUMMARY OF THE INVENTION

To this end, a method of providing a MEMS device is characterized in that an intermediate product is subjected to a plurality of MEMS method steps, said intermediate product
  defining a first main side and a second main side, and
  at least initially comprising a substrate body having a recess at the first main side, said recess comprising a bottom section and a top section relatively far from the second main side,
  wherein the bottom section is a recess section that is closest to the second main side, and the top section is a section of the recess closest to the first main side;
  wherein the multitude of method steps comprises the steps of
  providing the first main side of the intermediate substrate with a polymeric layer of positive photoresist, said polymeric layer having an outer surface facing away from the body and an inner surface facing the body,
  exposing the polymeric layer of positive photoresist in a direction from the outer surface of the positive photoresist towards the body of the intermediate substrate to light resulting in an exposed layer of positive photoresist comprising
  relatively strongly depolymerized positive photoresist in the top section of the recess while leaving
  relatively less strongly depolymerized positive photoresist in the bottom section of the recess;
  removing the relatively strongly depolymerized positive photoresist while leaving the relatively less strongly depolymerized positive photoresist in bottom section of the recess of the body so as to provide a protected area;
  providing structural material at the first main side and outside the protected area;
  etching at the protected area to provide the through-hole in the structural material.

In the method according to the present invention, the structural material is formed around the location where a hole is to be provided. It has been found that this provides a versatile manner of manufacturing a wide variety of MEMS devices with holes of arbitrary size and with a wide range of structural materials. This is for example useful when creating a hole in a tip of a probe. While currently corner lithography is possible by selective etching, the present method is relatively independent on the specific material type of the body. This allows for a wider range of materials suitable for use as a substrate.

The method allows the formation of differently sized holes, such as relatively large holes and/or with relative easy compared to existing methods. This done by varying the amount of depolymerization, for which several parameters are available, such as the duration of the exposure with light, the wavelength of the light, and the intensity of the light. In other words, by controlling the duration of the exposure to light and the light intensity, advantage can be taken from the fact that light is absorbed by the layer of positive photoresist. As a result of the absorption, the intensity of the light and hence the degree of depolymerization depends on the depth of penetration. Thus it is possible to control the amount of positive photoresist that is insufficiently depolymerized to remove in the subsequent step.

A further advantage of the present method is that the mask is formed in situ, with no alignment being required.

The use of positive photoresist for masking purpose is long known in the art. By way of example reference is made to "Planarization and trench filling on severe surface topography with thick photoresist for MEMS" by Jun-Bo Yoon et al in SPIE Vol. 351 027-786X/98/$10.0 (1998).

The term "structural material", which may also be referred to as wall material, refers to its structural use in the MEMS device. For example, in a probe comprising a cantilever with a hollow channel, it may be the material of the cantilever beam and tip.

According to a favourable embodiment, the substrate body is a crystalline substrate.

Using crystalline material it is easy to make well-defined recesses, in particular recesses tapering towards the second main side. The crystalline substrate is for example a semiconductor material such as silicon.

According to a favourable embodiment, the through-hole is a through-hole in a tip of a cantilever of a probe.

This is an important field of application for the present invention. The probe may be used for introducing a substance in a cell or for removing material from a cell. The probe may also be a probe for performing a measurement, such as an AFM probe (Atomic Force Microscopy Probe).

According to a favourable embodiment, the intermediate product comprises
  the body comprising a body material, and
  a first layer of a first material different from the body material at the first main side;
wherein
  after the step of removing the relatively strongly depolymerized positive photoresist while leaving the relatively less strongly depolymerized positive photoresist in bottom section of the recess of the body, the first layer is etched using the relatively less strongly depolymerized photoresist as a mask leaving a first area of first material on top of exposed body material,
  the step of providing structural material at the first main side comprises growing the layer of structural material by converting exposed body material of the substrate body into structural material of a composition different from the substrate body material using at least one of the remaining first material and the relatively less strongly depolymerized photoresist as a mask, and the step of etching the protected area comprises removing said remaining first material.

Thus a centrally located through-hole may be provided that is located centrally in the recess of the structural material. Such a through-hole may be of arbitrary size, depending on the degree of depolymerization of the photoresist, making the method very versatile.

Typically the less strongly depolymerized photoresist will be removed before the chemical conversion of body material into structural material.

According to a favourable embodiment, substrate body material is removed at the location of the recess so as to expose the structural material at the through-hole.

Thus an open channel is formed, which is useful for many applications. The body material may remain in place over part of the MEMS device so as to provide strength to the MEMS device.

BRIEF DESCRIPTION OF THE DRAWINGS

The present invention will now be illustrated with reference to the drawing where.

DETAILED DESCRIPTION OF THE INVENTION

Figure 1:
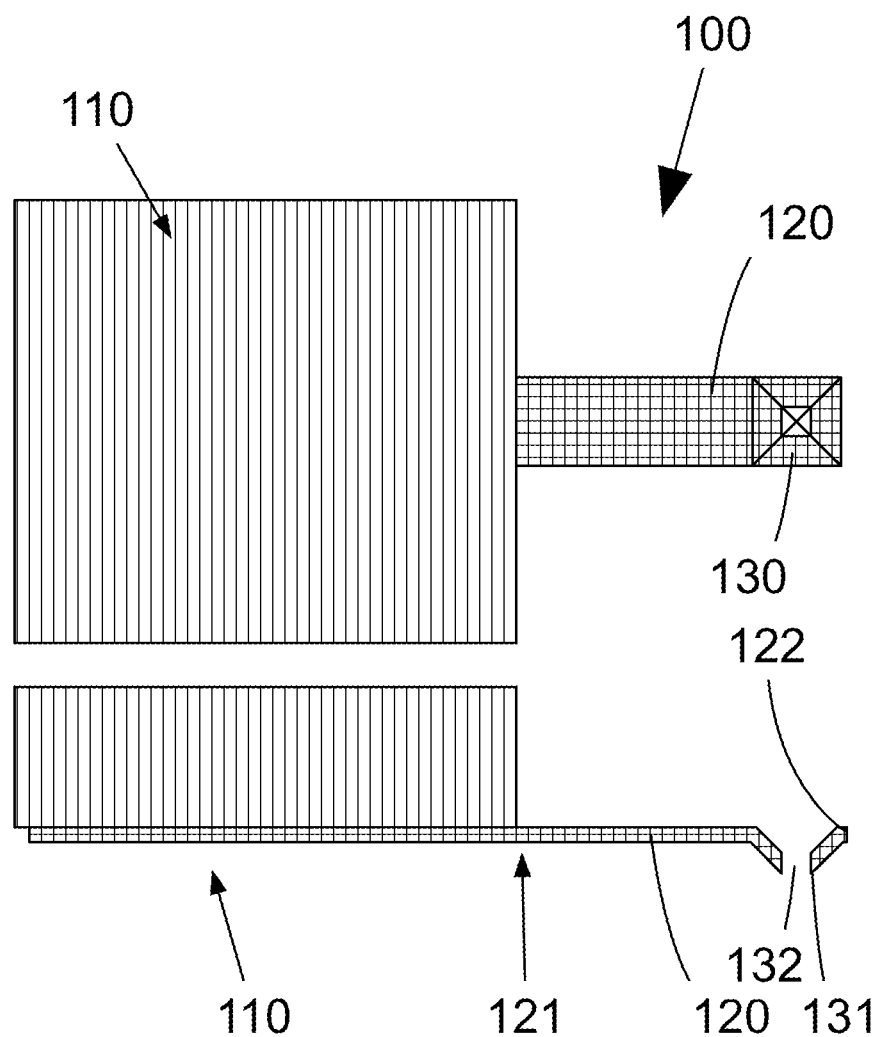
FIG. 1 shows a probe as can be manufactured using the method according to the invention, in top view (top) and cross-sectional view (bottom), both views being vertically aligned.

FIG. 1 shows a probe 100 as can be manufactured using the method according to the invention in top view (top) and cross-sectional view (bottom), both views being vertically aligned.

The probe 100 comprises a probe body section 110 and a cantilever 120. The cantilever 120 has a proximal end 121 connected to the probe body section 110 and a distal cantilever end 122.

The distal cantilever end 122 comprises a pyramidal tip 130 comprising a pyramidal tip end 131 comprising a central through-hole 132. This probe is described in "Nanoscale dispensing of liquids through cantilevered probes" (A. Meister et al. Microelectronic Engineering 67-68 (2003) 644-650) and its manufacture is replicated using the method according to the present invention, as will be illustrated below.

The method according to the invention will now be illustrated using FIG. 2A to FIG. 2K, which show in top view and cross-sectional view a method of manufacturing the probe 100 of FIG. 1. The method according to the present invention allows for a multitude of through-holes 132 and hence probes 100 to be manufactured at once, but the figures will show one probe 100 in the making only.

A silicon wafer 200 (a crystalline substrate, which will provide body 260) having a thickness of 380 um is shown (FIG. 2A) in top view. The silicon wafer 200 is of (1,0,0) silicon. If a pyramidal tip with three faces is desired, (1,1,1) silicon may be used instead.

Figure 2A:
FIG. 2A to FIG. 2K illustrate the manufacture of a cantilevered probe according to FIG. 1 in top view (top) and cross-sectional view (bottom), both views being vertically aligned.
Figure 2A:
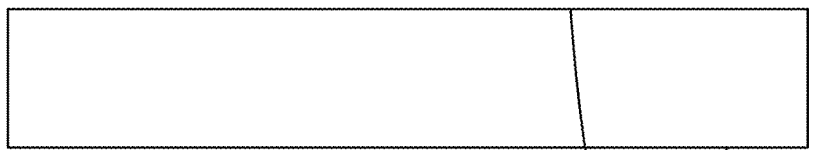
Figure 2B:
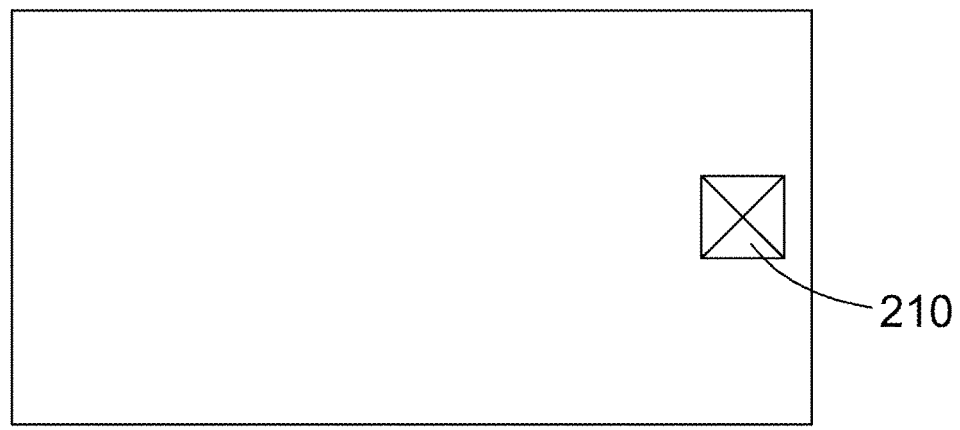
Figure 2B:
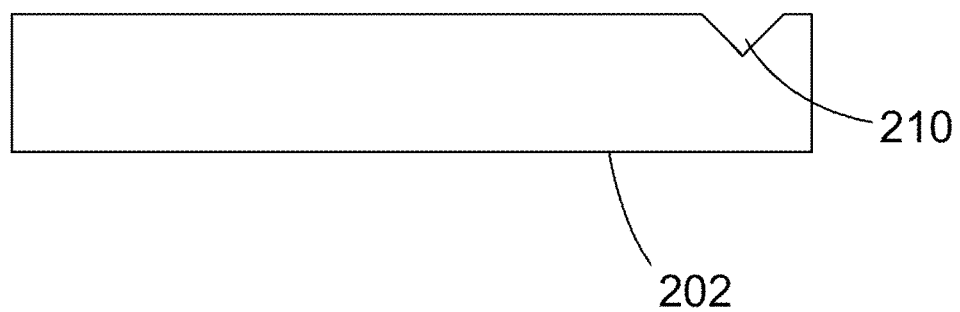
Figure 2C:
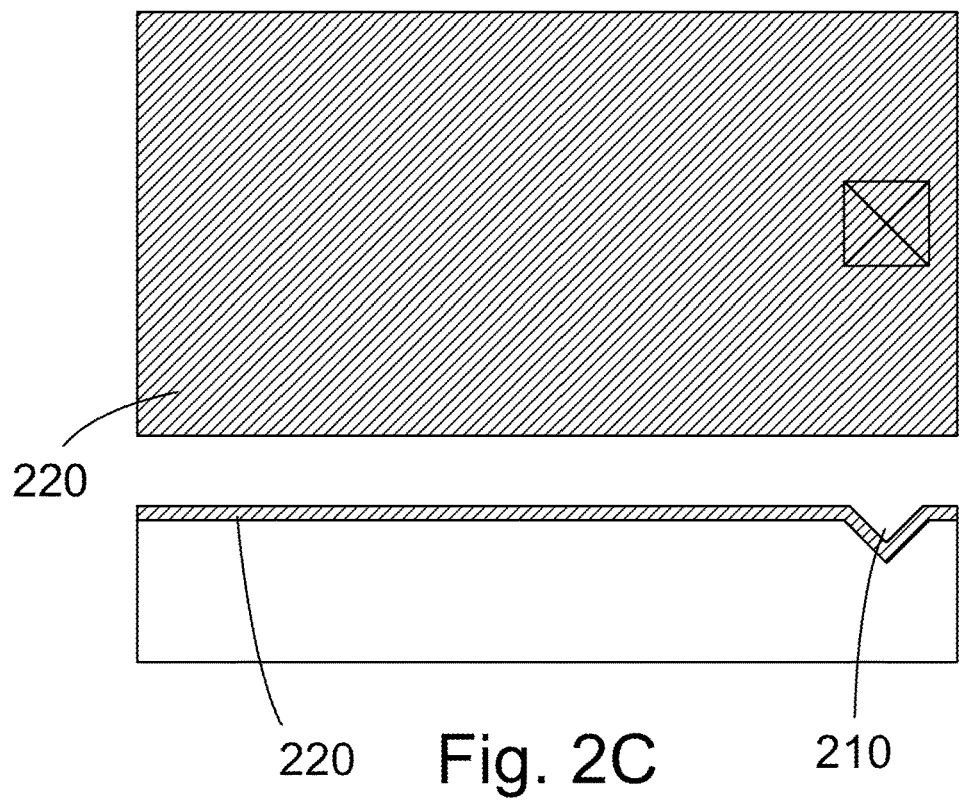

Using a mask, pyramidal recesses 210 (further on called pits; only one shown, singulars are used in the remainder of the figure description) is etched by wet anisotropic etching of the silicon using 25% KOH (FIG. 2B). The pyramidal pit 210 is 10 um by 10 um.

A thin layer of first material 220 (300 nm), here silicon nitride, is deposited (FIG. 2C) on the silicon wafer 200 comprising a pyramidal pit 210 (FIG. 2C) using Low Pressure Chemical Deposition (LPCVD) so as to result in an intermediate product, having a first main side 201 and a second main side 202.

Figure 2D:
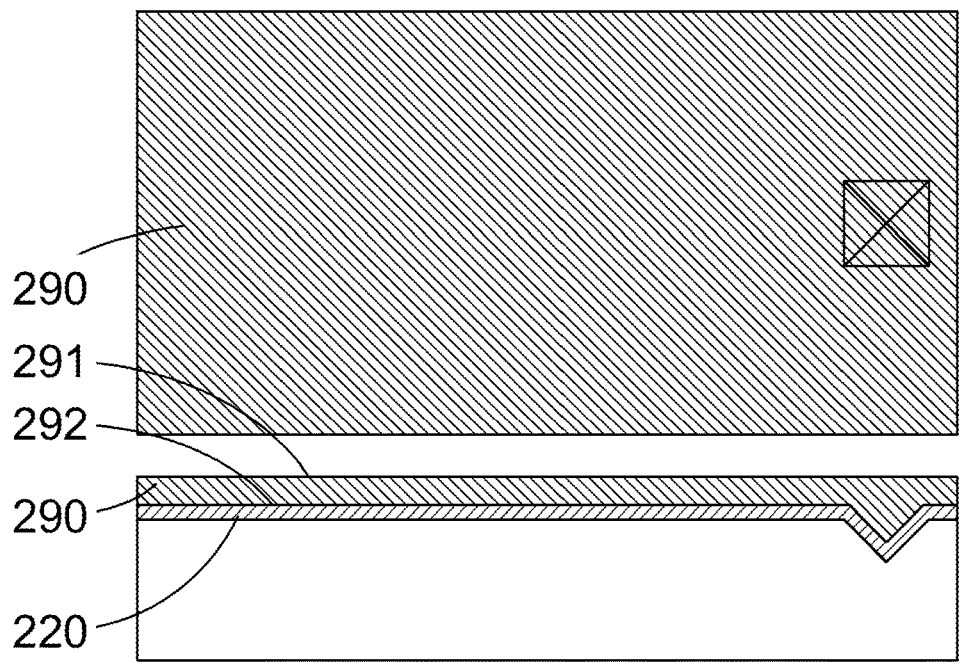
Figure 2E:
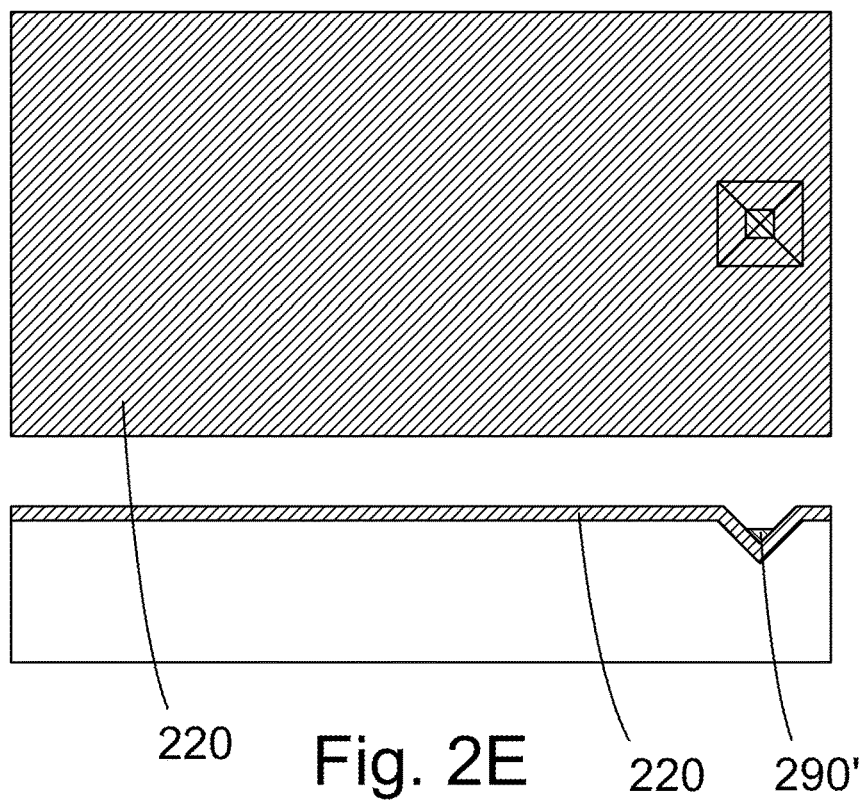
Figure 2F:
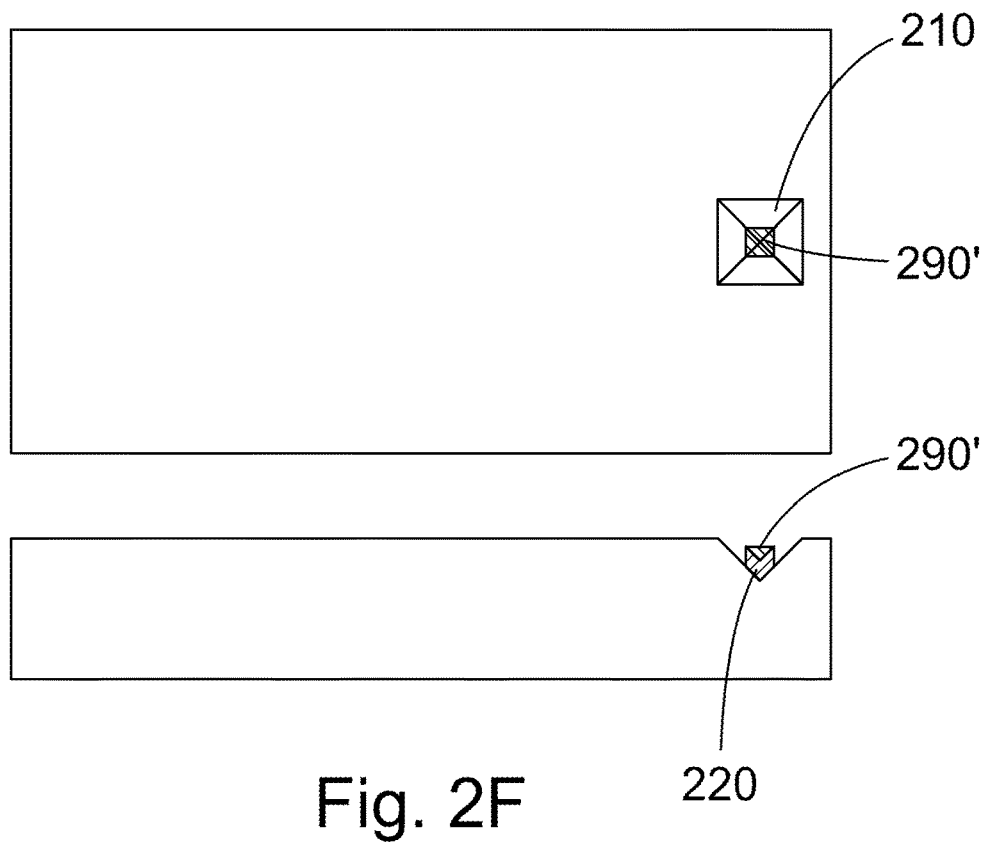

The intermediate product is provided with a layer of positive photoresist (OiR 907-17 photoresist available from FujiFilm), that polymerizes so as to yield a polymerized layer of positive photoresist 290 (FIG. 2D). It has an outer surface 291 and an inner surface 292 adjacent to the first layer.

The polymerized layer is subjected to light at the first main side 201 for a duration and with an intensity that causes depolymerization of the positive photoresist, exposing and thus depolymerizing the outer surface 291 more strongly than photoresist further from the outer surface 291, and in particular the photoresist in the bottom section of the pit 210, in accordance with physical law of the absorption of light. When the more strongly depolymerized positive photoresist is removed by development in an aqueous alkaline solution (OPD 4262 developer available from FujiFilm), relatively less strongly depolymerized positive photoresist 290' remains in the bottom section of the pit 210 (FIG. 2E) closest to the second main side 202.

The silicon nitride of the first layer 220 is etched away using Reactive Ion Etching (RIE), using the remaining relatively less strongly depolymerized photoresist 290' as a mask.

Figure 2G:
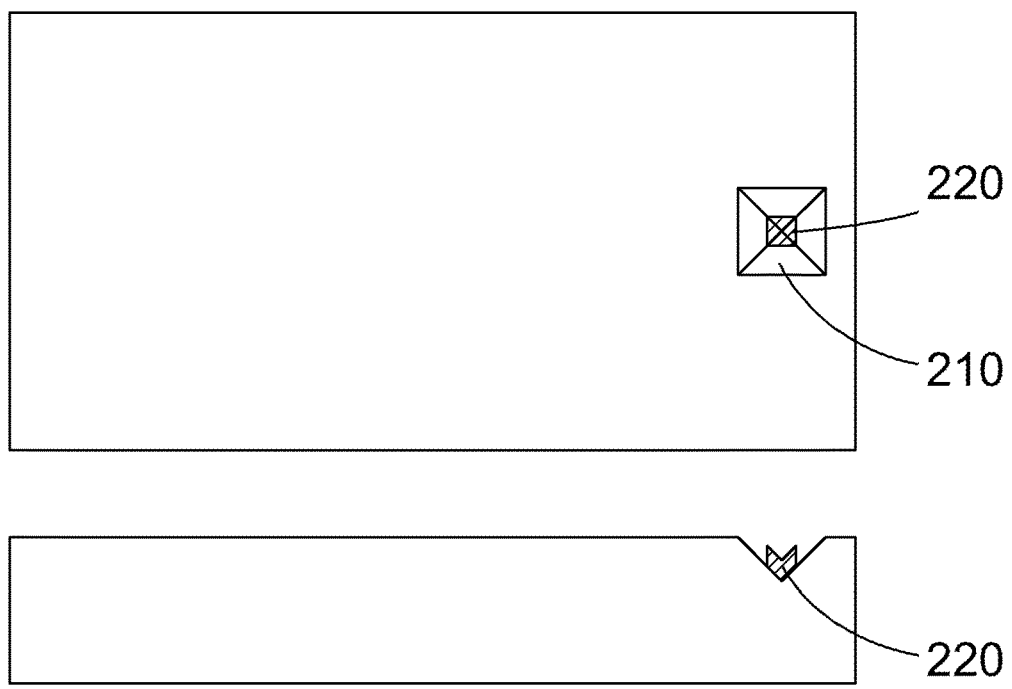
Figure 2H:
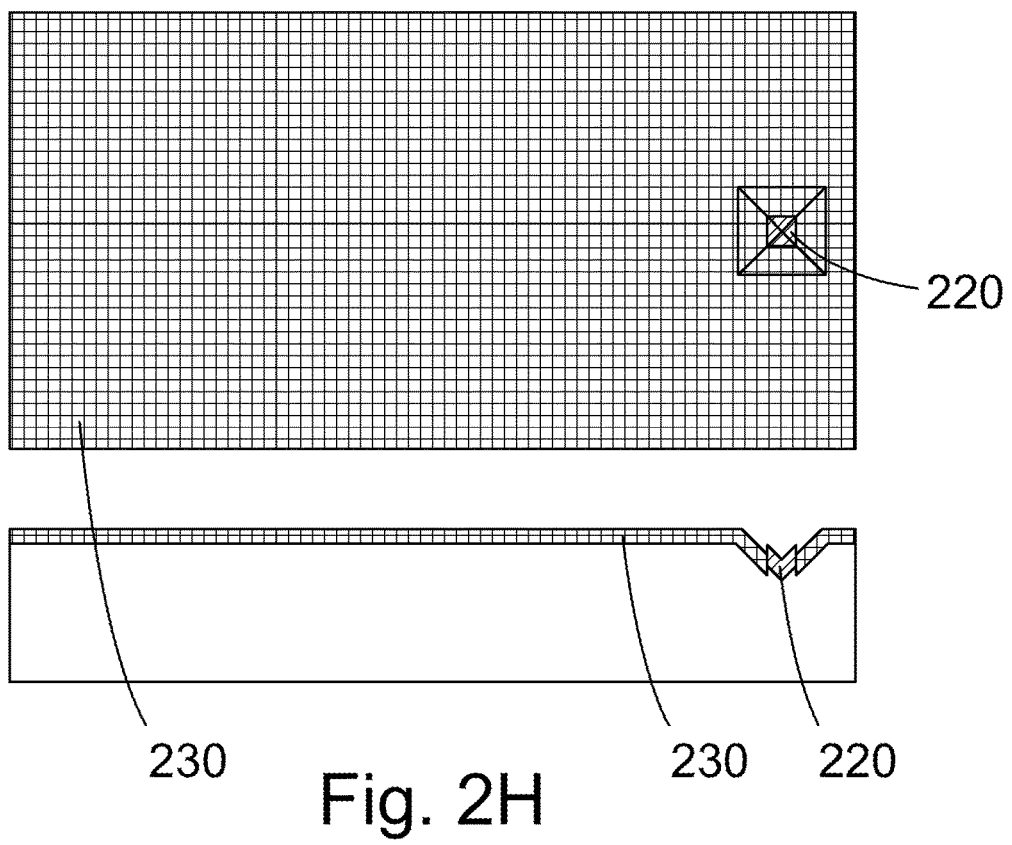

The less strongly depolymerized positive photoresist is removed using plasma etching (FIG. 2G).

The silicon of the body is oxidised (wet oxidation at 1000° C.), using the silicon nitride areas as a mask (FIG. 2H), resulting in a wall layer 230 of silicon dioxide.

Figure 2I:
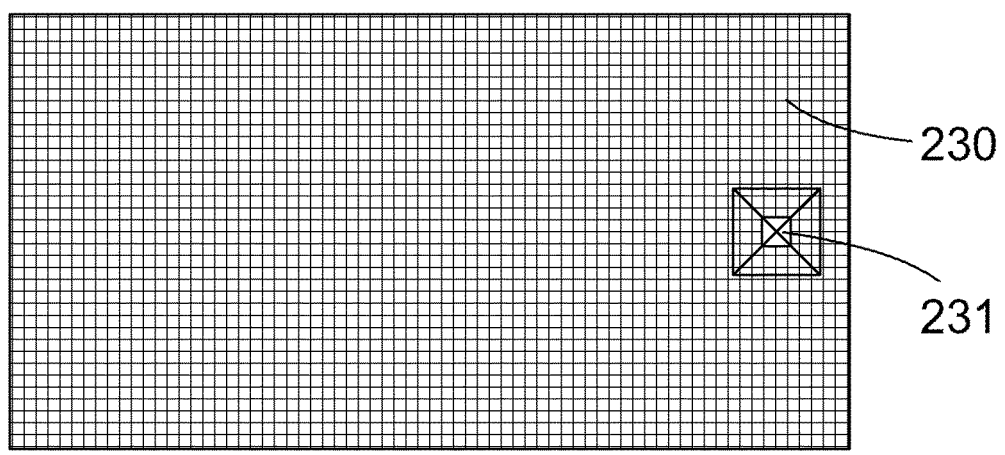
Figure 2I:
Figure 2J:
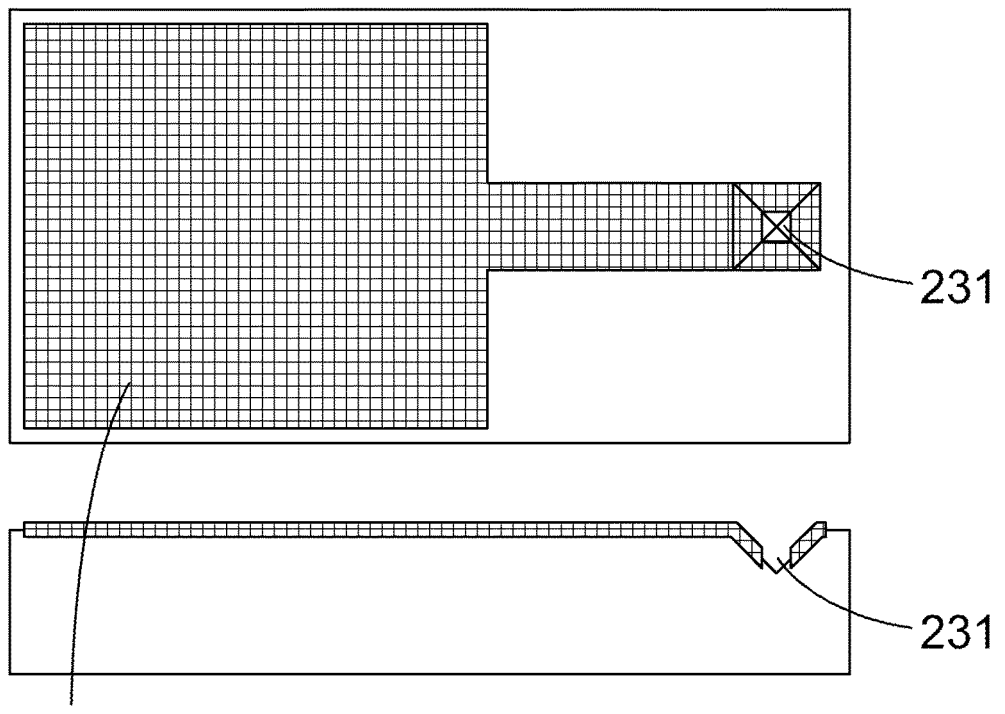
Figure 2K:
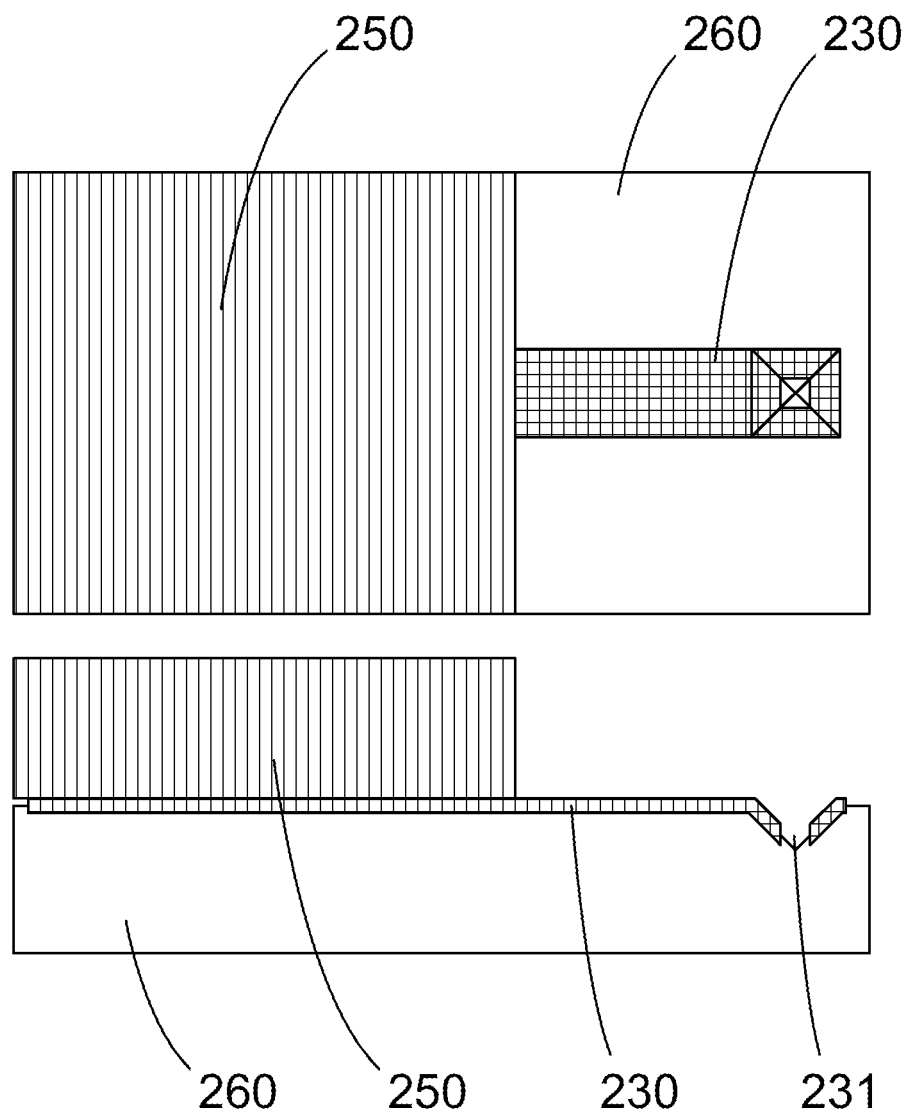

Silicon nitride is selectively removed by wet chemical etching (hot phosphoric acid), resulting in hole 231 in the wall layer 230 (FIG. 2I).

Regular patterning using RIE results in a probe layout.

After anodic bonding of a pre-diced glass wafer 250 (FIG. 2K), the bulk silicon of the body 260 is removed by wet chemical etching. Etching with hot Tetramethylammonium hydroxide (TMAH) solution results in the probe 100, shown in FIG. 1, with through-hole 132.

The present invention can be varied with in the scope of the appended claims. For example, an intermediate body comprising an etched first layer exposing the substrate body material may be provided with a structural material by deposition, allowing a greater choice of structural material as it does not depend on the chemical conversion of the substrate body material. The structural material will have a thickness that is less than the thickness of the first layer, allowing the first layer to be etched chemically so as to form the through-hole.

The invention claimed is:

1. A method of providing a MEMS device comprising a through-hole in a layer of structural material using MEMS method steps, wherein an intermediate product is subjected to a plurality of MEMS method steps, the intermediate product defining a first main side and a second main side, and at least initially comprising a substrate body having a recess at the first main side, the recess comprising a bottom section and a top section, wherein the bottom section is a section of the recess that is closest to the second main side and the top section is a section of the recess that is closest to the first main side;

wherein the method steps comprise the steps of:

providing the first main side of the intermediate substrate with a polymeric layer of positive photoresist, said polymeric layer having an outer surface facing away from the body and an inner surface facing the body, exposing the polymeric layer of positive photoresist in a direction from the outer surface of the positive photoresist towards the body of the intermediate substrate to light resulting in an exposed layer of positive photoresist comprising: a depolymerized positive photoresist in the top section of the recess while leaving a depolymerized positive photoresist in the bottom section of the recess that is less strongly depolymerized than the depolymerized positive photoresist in the top section of the recess;

removing the depolymerized positive photoresist in the top section of the recess while leaving the less strongly depolymerized positive photoresist in the bottom section of the recess of the body so as to provide a protected area;

providing structural material at the first main side and outside the protected area; and etching at the protected area to provide the through-hole in the structural material.

2. The method according to claim 1, wherein the substrate body is a crystalline substrate.

3. The method according to claim 1, wherein the through-hole is a through-hole in a tip of a cantilever of a probe.

4. The method according to claim 1, wherein the intermediate product comprises:

the substrate body comprising a body material, and a first layer of a first material different from the body material at the first main side;

wherein after the step of removing the depolymerized positive photoresist in the top section of the recess while leaving the less strongly depolymerized positive photoresist in the bottom section of the recess of the body, the first layer is etched using the less strongly depolymerized photoresist as a mask leaving a first area of first material on top of exposed body material, the step of providing structural material at the first main side comprises growing the layer of structural material by converting exposed body material of the substrate body into structural material of a composition different from the substrate body material using at least one of the remaining first material and the less strongly depolymerized photoresist as a mask, and the step of etching the protected area comprises removing said remaining first material.

5. The method according to claim 1, wherein substrate body material is removed at the location of the recess so as to expose the structural material at the through-hole.

* * * * *

UNITED STATES PATENT AND TRADEMARK OFFICE
CERTIFICATE OF CORRECTION

PATENT NO. : 11,174,155 B2
APPLICATION NO. : 16/619512
DATED : November 16, 2021
INVENTOR(S) : Edin Sarajlic It is certified that error appears in the above-identified patent and that said Letters Patent is hereby corrected as shown below:

On the Title Page

Item [73], delete "AG" and insert -- AG, (CH) --

In the Specification

Column 1, Line 5, delete "CROSS REFERENCE" and insert -- CROSS-REFERENCE --

Signed and Sealed this
Twelfth Day of July, 2022

Katherine Kelly Vidal
*Director of the United States Patent and Trademark Office*